US012618881B2

(12) United States Patent
Bedin

(10) Patent No.: US 12,618,881 B2
(45) Date of Patent: May 5, 2026

(54) DEVICE AND METHOD FOR RATIOMETRIC MEASUREMENT OF VOLTAGES FOR AN ANALOG-DIGITAL-CONVERTER

(71) Applicant: AVL Software and Functions GmbH, Regensburg (DE)

(72) Inventor: Michele Bedin, Regensburg (DE)

(73) Assignee: AVL Software and Functions GmbH, Regensburg (DE)

( * ) Notice: Subject to any disclaimer, the term of this patent is extended or adjusted under 35 U.S.C. 154(b) by 120 days.

(21) Appl. No.: 18/381,793

(22) Filed: Oct. 19, 2023

(65) Prior Publication Data

US 2024/0133929 A1    Apr. 25, 2024
US 2024/0230730 A9    Jul. 11, 2024

(30) Foreign Application Priority Data

Oct. 25, 2022    (DE)  ..................... 10 2022 128 251.1

(51) Int. Cl.
*H03M 1/36*      (2006.01)
*G01R 19/257*    (2006.01)
*H03M 1/06*      (2006.01)

(52) U.S. Cl.
CPC ........ *G01R 19/257* (2013.01); *H03M 1/0619* (2013.01)

(58) Field of Classification Search
CPC ...... G01R 19/257; H03M 1/0619; H03M 1/12
(Continued)

(56) References Cited

U.S. PATENT DOCUMENTS 6,580,277 B1 *   6/2003   Bolz ........................ G01D 3/08
                                                324/608
7,675,447 B1 *   3/2010   Coulson ................ H03M 3/494
                                                341/143

(Continued)

FOREIGN PATENT DOCUMENTS

EP          3627708 B1    8/2021

OTHER PUBLICATIONS

Office Action re: German Pat. Appln. No. 10 2022 128 251.1 filed on Oct. 25, 2022; Sep. 11, 2023; 5 pages; Deutsches Patent- und Markenamt; Munich Germany. no translation available.

*Primary Examiner* — Jean B Jeanglaude
(74) *Attorney, Agent, or Firm* — Rogue.law; Laura Schneider

(57)             ABSTRACT

A device for ratiometric measurement of voltages for an analog-digital-converter is disclosed. A reference voltage is provided to a microcontroller and a first supply voltage is provided to a first sensor and the microcontroller by a functional providing unit. The first sensor is connected to the microcontroller in terms of signaling by transmitting sensor signals. The microcontroller has a first multiplexer and a second multiplexer. The multiplexers output signals to the analog-digital-converter. The reference voltage and the first supply voltage are present on the input side at the first multiplexer and at the second multiplexer. In a first switching state the first supply voltage can be measured on the output side by using the reference voltage as a reference for the analog-digital-converter. In a second switching state the reference voltage can be measured by using the first supply voltage as a reference for the analog-digital-converter.

9 Claims, 4 Drawing Sheets

Figure 1:
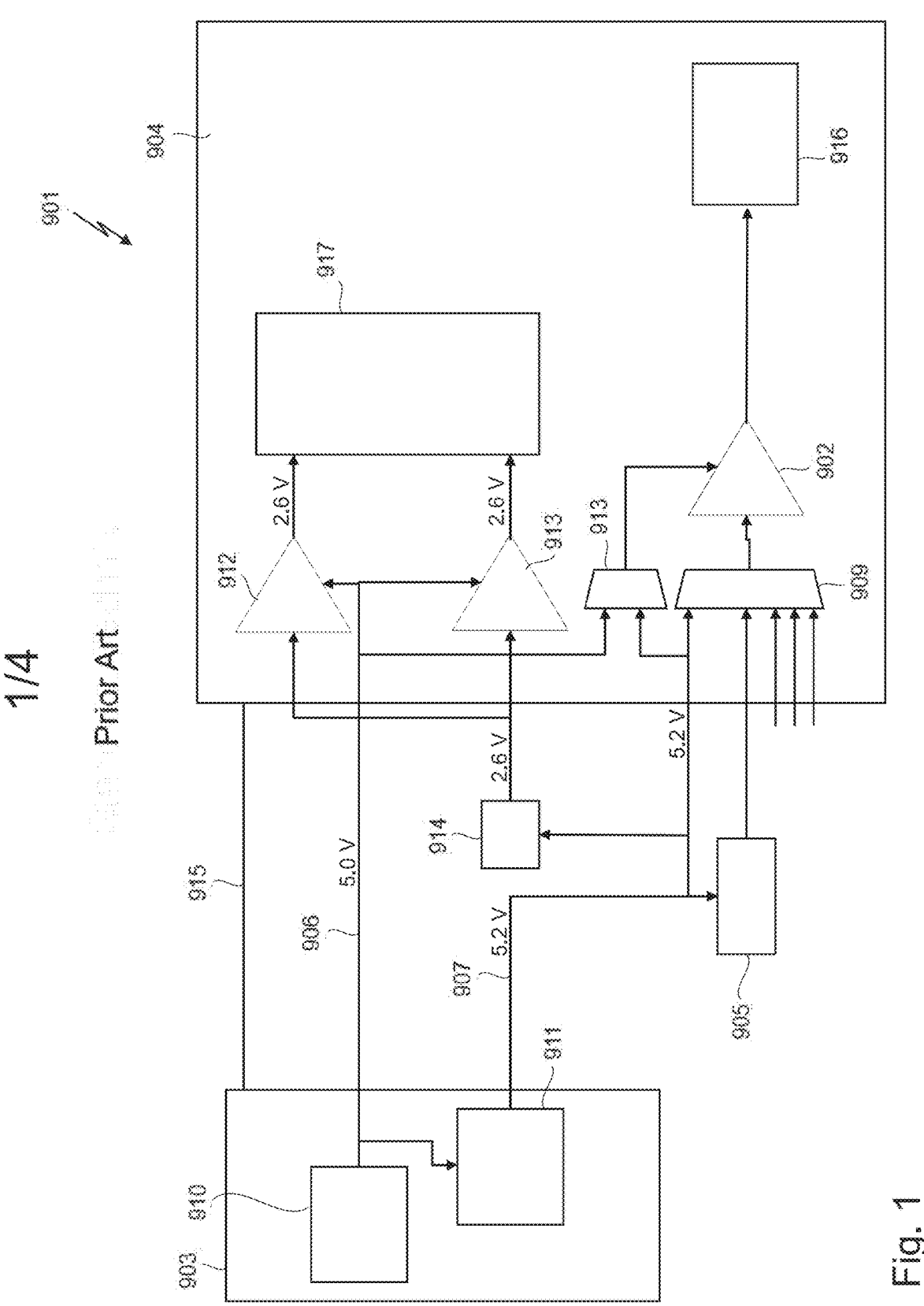

(58) Field of Classification Search
USPC ......................................................... 341/159
See application file for complete search history.

(56) References Cited

U.S. PATENT DOCUMENTS

| | | | |
|---|---|---|---|
| 10,840,835 B2* | 11/2020 | Yu | G01D 5/204 |
| 2018/0188076 A1* | 7/2018 | Acker | G01D 5/204 |
| 2020/0209289 A1 | 7/2020 | Okuda et al. | |

* cited by examiner

1/4

Prior Art

DEVICE AND METHOD FOR RATIOMETRIC MEASUREMENT OF VOLTAGES FOR AN ANALOG-DIGITAL-CONVERTER

The present application relates to a device and method for ratiometric measurement of voltages for an analog-digital-converter and preferably for monitoring a voltage, for example a supply voltage.

Such devices or methods are known from the prior art, which comprise a system base chip, a microcontroller and a first sensor, wherein a reference voltage is provided to the microcontroller by the system base chip and a first supply voltage is provided to the first sensor and the microcontroller, and wherein the first sensor is connected to the microcontroller by means of transmitting sensor signals, and wherein the microcontroller comprises a first multiplexer and a second multiplexer, wherein the multiplexers outputs signals to the analog-digital-converter.

Starting from the first supply voltage, a voltage divider is provided according to the prior art, by means of which the supply voltage is divided and provided to two further analog-digital-converters, by means of which a statement can then finally be made about the present voltages.

Due to the fact that several analog-digital-converters and a voltage divider are needed, several slots of the microcontroller are occupied and more space is required by the voltage divider.

The object of the underlying application is therefore to provide a device and a method for ratiometric measurement of voltages for an analog-digital-converter, by means of which the disadvantages of the prior art can be overcome, so that several analog-digital-converters and the voltage divider can be dispensed with.

The underlying object is solved on the one hand by means of a device for ratiometric measurement of voltages for an analog-digital-converter having the features of claim 1 and a method for ratiometric measurement of voltages for an analog-digital-converter.

The core idea of the invention is to provide a device for ratiometric measurement of voltages for an analog-digital-converter, wherein the device comprises a functional providing unit, a microcontroller and a first sensor, wherein the functional providing unit provides a reference voltage to the microcontroller and a first supply voltage provides a reference voltage to the first sensor and the microcontroller, and wherein the first sensor being connected to the microcontroller by means of transmitting sensor signals, and wherein the microcontroller comprising a first multiplexer and a second multiplexer, wherein the multiplexers outputs signals to the analog-digital-converter. According to the invention, it is provided that the reference voltage and the first supply voltage are applied to the first multiplexer and to the second multiplexer, respectively, on the input side. Furthermore, in a first switching state, the first supply voltage can be measured on the output side by using the reference voltage as a reference for the analog-digital-converter, and in a second switching state, the reference voltage can be measured by using the first supply voltage as a reference for the analog-digital-converter.

Likewise, the device can be provided for monitoring the voltages, in particular the supply voltage, which can further increase safety. Thus, a device for ratiometric measurement of voltages for an analog-digital-converter and to monitor the voltages can be provided.

An analog-digital-converter (ADC) may also be known as an analog-digital-transducer.

The analog-digital-converter is preferably embedded in or part of the microcontroller.

The first sensor is a sensor which records environmental data and transmits it as sensor data to a further component. Particularly preferably, the first sensor can be an automotive sensor. Further preferably, a plurality of sensors are provided, which can be arranged and formed analogously to the first sensor.

Furthermore, a functional providing unit is provided according to the invention. The functional providing unit is arranged and intended to provide at least one electronic function. According to the invention, the functional providing unit is formed and intended to provide the reference voltage and the supply voltage. The functional providing unit can be a system basis chip (SBC) or a power management integrated circuit (PMIC), by means of which, among other things, voltages can be provided. The reference voltage is applied to the microcontroller, the first supply voltage is applied to the first sensor. If several sensors are provided, ideally each sensor has its own supply voltage. Further functions of a functional providing unit can be at least one selected from a voltage monitor, a watchdog, a BUS interface, a wake-up logic, a power driver or any combination thereof, wherein this list is not to be understood as exhaustive.

The microcontroller also has a first multiplexer and a second multiplexer. The multiplexers are on the input side, i.e. on the input side of the respective multiplexer, in such a way that the reference voltage and the first supply voltage are present in each case.

It is provided that the supply voltage can be measured or accessed at an input on the sensor.

According to the invention, it is intended that a first switching state and a second switching state are provided, wherein the switching states preferably refer to the multiplexers and the microcontroller, respectively. It is provided that in the first switching state the first supply voltage can be measured on the output side by using the reference voltage as a reference for the analog-digital-converter and in a second switching state the reference voltage can be measured by using the first supply voltage as a reference for the analog-digital-converter. Output side means it is related to the output side of the multiplexer.

According to the invention, it can be achieved by means of the provided arrangement and by means of the switching states that the ratiometric measurement of the voltages is performed by a single analog-digital-converter. This leads to a significantly simpler switching structure and to a reduction in the number of components.

According to a preferred embodiment, the first multiplexer and the second multiplexer are arranged parallel to each other on the input side with respect to the first supply voltage.

This means that the first supply voltage forms one input of the first multiplexer and one input of the second multiplexer. Thus, each of the multiplexers can be switched to this input.

Also according to a further preferred embodiment, it can be provided that the first multiplexer and the second multiplexer are arranged parallel to each other on the input side with respect to the reference voltage.

This means that the reference voltage forms one input of the first multiplexer and one input of the second multiplexer. Thus, each of the multiplexers can be switched to this input.

It is particularly preferred that the first multiplexer and the second multiplexer are arranged on the input side with respect to the first supply voltage, and the first multiplexer and the second multiplexer are arranged on the input side with respect to the reference voltage parallel to each other. Thus, the respective switching state of the multiplexers can be set so that the measurement can be performed by means of the analog-digital-converter.

Particularly preferably, it can be provided that, in the first switching state in the first multiplexer the reference voltage is selected as an input signal and is connected through to an output of the first multiplexer; and in the second multiplexer the first supply voltage is selected as an input signal and is connected through to an output of the second multiplexer.

This allows the first supply voltage to be measured on the output side in the first switching state by using the reference voltage as a reference for the analog-digital-converter.

Particularly preferably, it can be provided that, in the second switching state in the first multiplexer the first supply voltage is selected as an input signal and is connected through to an output of the first multiplexer; and in the second multiplexer the reference voltage is selected as an input signal and is connected through to an output of the second multiplexer.

This allows the reference voltage to be measured in the second switching state by using the first supply voltage as a reference for the analog-digital-converter.

The measurements of the voltages with different referencing are in the present case the ratiometric measurement, only with considerably reduced constructional effort.

Particularly preferably, according to one embodiment, it can be provided that the analog-digital-converter is provided and formed to perform the measurements in the first switching state and the second switching state, and wherein the analog-digital-converter is provided and formed to detect whether the first supply voltage is greater than or equal to the reference voltage in the first switching state and whether the first supply voltage is greater than or equal to the reference voltage in the second switching state.

The statement as to whether the first supply voltage is greater than or equal to the reference voltage is decisive for the operation of the analog-digital-converter. If this is the case, the analog-digital-converter is saturated ("ADC saturation").

The further statement about whether the first supply voltage is greater than or equal to the reference voltage is also important for the operation. This makes it possible to know voltage differences between the reference voltage and the supply voltage, so that the sensor signals must be adapted accordingly to these deviations in order to be able to obtain reliable data.

According to a further preferred embodiment, it can be provided that the reference voltage is provided by a first voltage regulator and the first supply voltage is provided by a second voltage regulator. Particularly preferably, the voltage regulators are part of the functional providing unit.

Further preferably, it can be provided that the first voltage regulator is connected to the second voltage regulator by means of signalling in such a way that a change in the reference voltage causes a change in the first supply voltage. An increase or decrease of the reference voltage without a corresponding adjustment of the supply voltage would lead to problems when operating the device.

According to a further embodiment, it can be provided that the functional providing unit and the microcontroller are spaced apart. Likewise, it is preferred that the sensor is spaced apart from the functional providing unit and the microcontroller. Thus, they are separate components, which ensures easy interchangeability. The functional providing unit, the microcontroller and the sensor are connected to each other by means of signalling and/or electrically.

According to a preferred embodiment, it can be provided that the analog-digital-converter outputs ratiometric sensor values.

It is further preferred that a connection between the reference voltage and the second multiplexer is implemented on the input side inside or outside the microcontroller. Inside the microcontroller, it is conceivable that the respective inputs of the multiplexers are conductively connected. The same applies to the outside of the microcontroller, so that inputs of the multiplexers, represented by pins of the microcontroller, are conductively connected to each other.

The underlying object is further solved by a method for ratiometric measurement of voltages for an analog-digital-converter and for monitoring a voltage, in particular a supply voltage, comprising the method steps:

a) providing a device according to one embodiment;

b) switching the device into the first switching state and measuring the first supply voltage by using the reference voltage as reference for the analog-digital-converter; or switching the device into the second switching state and measuring the reference voltage by using the first supply voltage as reference for the analog-digital-converter.

The various embodiments with all their features can be combined and interchanged as desired.

The features of the device and the method for ratiometric measurement of voltages for an analog-digital-converter and preferably for monitoring a voltage can be interchanged and used in a corresponding manner. Features, included in the device can thus be used as method features, included in the process and vice versa.

Further advantageous embodiments result from the subclaims.

Further aims, advantages and usefulness of the present invention are to be taken from the following description in conjunction with the drawings.

Figure 2:
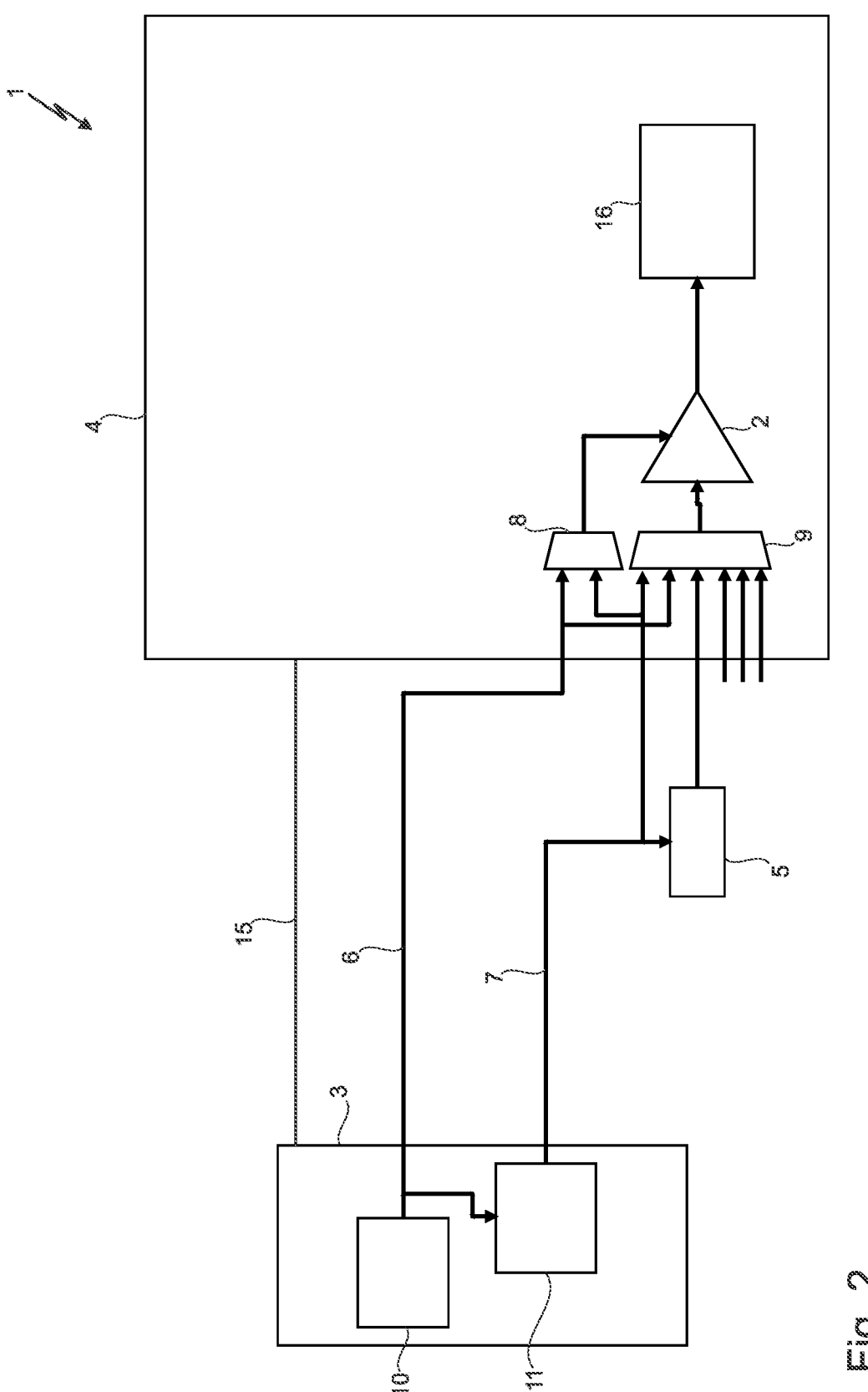
Figure 3A:
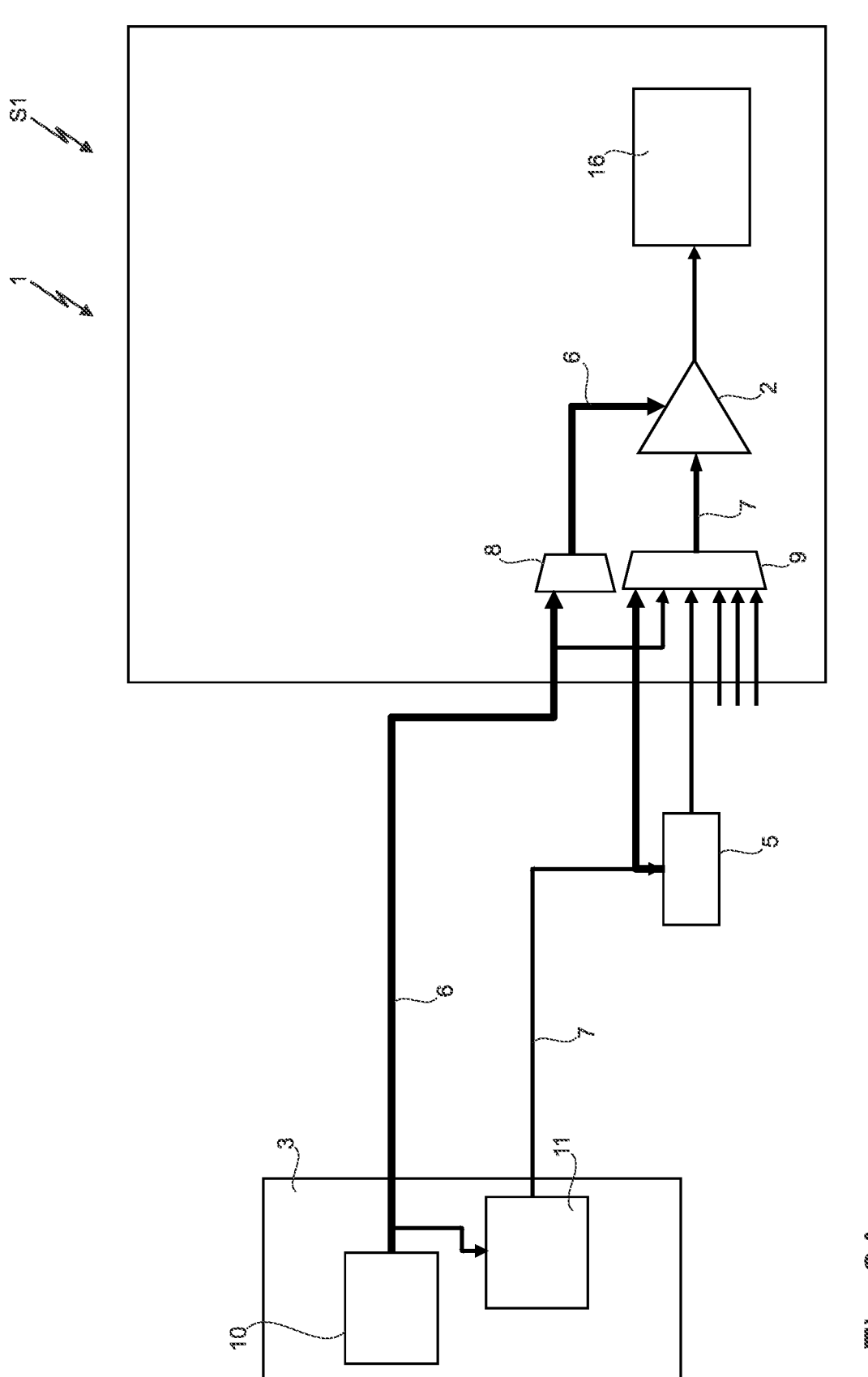
Figure 3B:
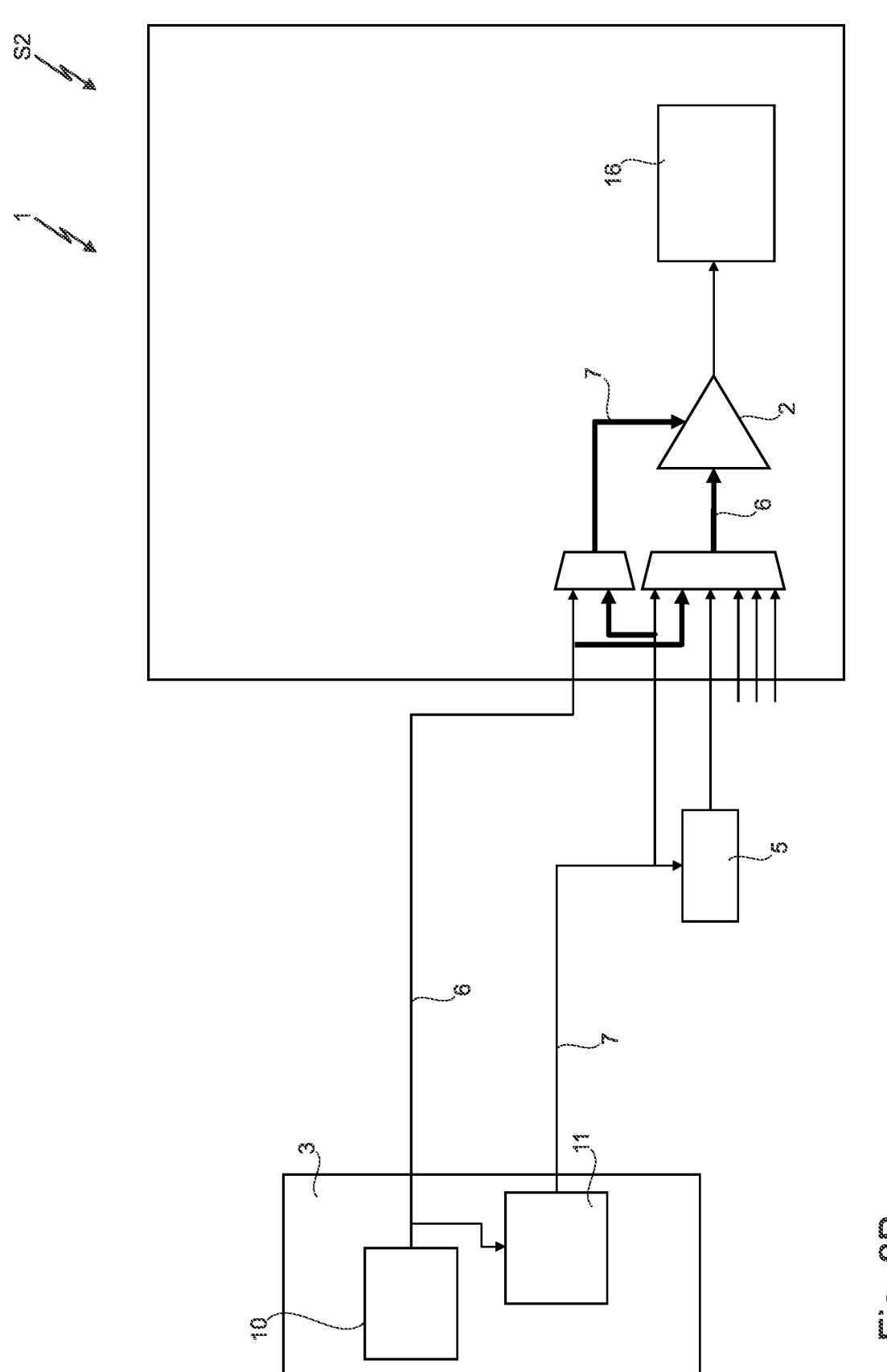

The following figures show:

FIG. 1 a device according to the prior art;

FIG. 2 a device according to a preferred embodiment;

FIG. 3A a representation of the first switching state of the device according to FIG. 2;

FIG. 3B a representation of the second switching state of the device according to FIG. 2.

In the figures, identical components are to be understood with the corresponding reference sign in each case. For the sake of clarity, some components in the figures may not have a reference sign, but have been designated elsewhere.

FIG. 1 shows a device 901 according to the prior art, by means of which a ratiometric measurement of voltages can be performed.

The device 901 comprises a functional providing unit 903 and a microcontroller 904. At least one sensor 905 is also provided, in this case the first sensor 905. In contrast, and with reference to FIG. 2, it is clear that the device 1 according to the invention is not limited to a single sensor 5.

Furthermore, the prior art functional providing unit 903 has a first voltage regulator 910 and a second voltage regulator 911. The first voltage regulator 910 outputs a reference voltage 906 to the microcontroller 904, wherein the second voltage regulator 911 providing a supply voltage 907 to the sensor 905. The voltages are always to be understood with respect to a main conducting line 915, so that in each case the potential difference indicates the respective voltage.

The prior art microcontroller 904 comprises a first multiplexer 908 and a second multiplexer 909, which are each connected on the output side to an analog-digital-converter 902. On the input side, the supply voltage 907 is applied to each of the multiplexers 908, 909. The values output by the analog-digital-converter 902 can be further processed by means of a first processing unit 916.

Furthermore, a voltage divider 914 is provided in the prior art device 900, which is also connected to the supply voltage 907 and divides the supply voltage 907. In the present example of the prior art, the supply voltage 907 has a value of 5.2 V, so that the output voltage of the voltage divider 914 is 2.6 V.

This divided voltage in the prior art device 900 is applied to a first further analog-digital-converter 912 and a second further analog-digital-converter 913. Furthermore, the reference voltage 906 is applied to these further analog-digital-converters 912, 913. The outputs of the second further analog-digital-converters 912, 913 are further processed in a second processing unit 917, for example by means of software which is stored in the second processing unit 917.

As illustrated in FIG. 2 and in contrast to FIG. 1, the device 1 according to the invention now represents a considerable improvement, since the voltage divider 914 as well as the further analog-digital-converters 912, 913 and, in addition, also the second processing unit 917 required in the prior art 900 can be dispensed with in the device 1, at least with respect to the ratiometric measurement and monitoring of the supply voltage 7.

According to the invention, it is provided according to FIG. 2 that a device 1 for ratiometric measurement of voltages is provided for an analog-digital-converter 2, wherein the device comprises a functional providing unit 3, a microcontroller 4 and a first sensor 5, wherein a reference voltage 6 is provided to the microcontroller 4 and a first supply voltage 7 is provided to the first sensor 5 and the microcontroller 4 by the functional providing unit 3, and wherein the first sensor 5 is connected to the microcontroller 4 by means of transmitting sensor signals, and wherein the microcontroller 4 comprises a first multiplexer 8 and a second multiplexer 9, wherein the multiplexers 8, 9 output signals to the analog-digital-converter 2. According to the invention, the reference voltage 6 and the first supply voltage 7 are applied to the input of the first multiplexer 8 and the second multiplexer 9 respectively, wherein, in a first switching state S1, the first supply voltage 7 is output by using the reference voltage 6 as a reference for the analog-digital-converter 2 and, in a second switching state S2, the supply voltage 7 is output by using the reference voltage 6 as a reference for the analog-digital-converter 2.

The circuit according to the invention can be seen in FIG. 2, the switching positions S1, S2 can be seen in FIGS. 3A and 3B and are described in more detail below.

Further according to FIG. 2, it is shown that the first multiplexer 8 and the second multiplexer 9 are arranged parallel to each other on the input side with respect to the first supply voltage 7 and that the first multiplexer 8 and the second multiplexer 9 are arranged parallel to each other on the input side with respect to the reference voltage 6. This means that both the reference voltage 6 and the supply voltage 7 form an input of the respective multiplexer 8, 9.

The analog-digital-converter 2 is provided and formed to perform the measurements in the first switching state S1 and the second switching state S2. Further preferably, the analog-digital-converter 2 is provided and formed to detect whether in the first switching state S1 the first supply voltage 7 is greater than or equal to the reference voltage 6 and whether in the second switching state S2 the first supply voltage 7 is greater than or equal to the reference voltage 6.

The respective switching states S1, S2 can be realized, for example, in such a way that in the first switching state, in the first multiplexer 8 the reference voltage 6 is selected as an input signal and is connected through to an output of the first multiplexer 8; and in the second multiplexer 9 the first supply voltage 7 is selected as an input signal and is connected through to an output of the second multiplexer 9;

and that in the second switching state S2 in the first multiplexer 8 the first supply voltage 7 is selected as an input signal and is connected through to an output of the first multiplexer 8; and in the second multiplexer 9 the reference voltage 6 is selected as an input signal and is connected through to an output of the second multiplexer 9.

According to the invention, it can be achieved by means of the provided arrangement and by means of the switching states S1, S2 that the ratiometric measurement of the voltages and monitoring of the supply voltage 7 can be performed by a single analog-digital-converter 2. This leads to a considerably simpler switching structure and to a reduction in the number of components.

In the first switching state S1, the first supply voltage 7 can be measured on the output side by using the reference voltage 6 as a reference for the analog-digital-converter 2.

In the second switching state S2, the reference voltage 6 can be measured by using the first supply voltage 7 as a reference for the analog-digital-converter 2.

The measurements of the voltages with different references are in the present case the ratiometric measurement and monitoring of the supply voltage, only with considerably reduced constructional effort.

The values output by the analog-digital-converter 2 can be further processed by means of a first processing unit 16.

The values output are the values relating to the different measurements from the switching states S1, S2, so that ratiometric measurement and monitoring is possible by means of a single analog-digital-converter 2.

FIG. 3A shows the first switching state S1 and FIG. 3B shows the second switching state S2.

In the first switching state S1, the reference voltage 6 is selected on the input of the first multiplexer 8 and the supply voltage 7 is selected on the input of the second multiplexer 9 and accordingly connected through as an output of the respective multiplexer 8, 9, so that the corresponding output signals of the multiplexers 8, 9 are made available to the analog-digital-converter 2.

The respective selected input signals are shown by thick drawn arrows.

In the second switching state S2, the supply voltage 7 is selected on the input side of the first multiplexer 8 and the reference voltage 6 is selected on the input side of the second multiplexer 9 and accordingly connected through as an output of the respective multiplexer 8, 9, so that the corresponding output signals of the multiplexers 8, 9 are made available to the analog-digital-converter 2.

The respective selected input signals are shown by thick drawn arrows.

All features disclosed in the application documents are claimed to be essential to the invention insofar as they are individually and in combination new compared to the prior art.

LIST OF REFERENCE SIGNS

1 Device
2 Analog-digital-converter
3 Functional providing unit
4 Microcontroller
5 First sensor
6 Reference voltage
7 Supply voltage
8 First multiplexer
9 Second multiplexer
10 First voltage regulator
11 Second voltage regulator
12 First further analog-digital-converter
13 Second further analog-digital-converter
14 Voltage divider
15 Main conducting line
16 First processing unit
17 Second processing unit
S1 First switching state
S2 Second switching state

The invention claimed is:

1. A device for ratiometric measurement of voltages and monitoring of at least one voltage for an analog-digital-converter, wherein the device comprises a functional providing unit, a microcontroller and a first sensor, wherein a reference voltage is provided to the microcontroller and a first supply voltage is provided to the first sensor and the microcontroller by the functional providing unit, and wherein the first sensor is connected to the microcontroller in terms of signaling by transmission of sensor signals, and wherein the microcontroller comprises a first multiplexer and a second multiplexer, wherein the multiplexers output signals to the analog-digital-converter, wherein:

the reference voltage and the first supply voltage are connected to the input side of the first multiplexer and to the input side of the second multiplexer respectively, wherein the first multiplexer and the second multiplexer are arranged in parallel to each other on the input side with respect to the first supply voltage, and the first multiplexer and the second multiplexer are arranged parallel to each other on the input side with respect to the reference voltage, and wherein it is possible to measure the first supply voltage on the output side in a first switching state by using the reference voltage as a reference for the analog-digital-converter and to measure the reference voltage in a second switching state by using the first supply voltage as a reference for the analog-digital-converter without dividing the first supply voltage.

2. A method for ratiometric measurement and monitoring of voltages for an analog-digital-converter, comprising the method steps:

(a) providing a device according to claim 1;
(b) switching the device to the first switching state and measuring the first supply voltage by using the reference voltage as a reference for the analog-digital-converter; or switching the device to the second switching state and measuring the reference voltage by using the first supply voltage as a reference for the analog-digital-converter.

3. The device according to claim 1, wherein:
a connection between the reference voltage and the second multiplexer is implemented on the input side of the second multiplexer at the inside or outside of the microcontroller.

4. The device according to claim 1, wherein:
in the first switching state
in the first multiplexer the reference voltage is selected as an input signal and is connected through to an output of the first multiplexer; and
in the second multiplexer the first supply voltage is selected as an input signal and is connected through to an output of the second multiplexer.

5. The device according to claim 1, wherein
in the second switching state
in the first multiplexer the first supply voltage is selected as an input signal and is connected through to an output of the first multiplexer; and
in the second multiplexer the reference voltage is selected as an input signal and is connected through to an output of the second multiplexer.

6. The device according to claim 1, wherein:
the analog-digital-converter is provided and formed to perform the measurements in the first switching state and the second switching state, and wherein the analog-digital-converter is provided and formed to detect whether in the first switching state the first supply voltage is greater than or equal to the reference voltage and whether in the second switching state the first supply voltage is greater than or equal to the reference voltage.

7. The device according to claim 1, wherein:
the reference voltage is provided by a first voltage regulator and the first supply voltage is provided by a second voltage regulator, wherein the first voltage regulator is connected to the second voltage regulator in terms of signaling in such a way that a change in the reference voltage causes a change in the first supply voltage.

8. The device according to claim 1, wherein:
the functional providing unit and the microcontroller are spaced apart.

9. The device according to claim 1, wherein:
the analog-digital-converter outputs a ratiometric sensor value.

* * * * *